United States Patent [19]

Lam

[11] Patent Number: 5,249,728
[45] Date of Patent: Oct. 5, 1993

[54] BUMPLESS BONDING PROCESS HAVING MULTILAYER METALLIZATION

[75] Inventor: Ken Lam, Colorado Springs, Colo.

[73] Assignee: Atmel Corporation, San Jose, Calif.

[21] Appl. No.: 29,148

[22] Filed: Mar. 10, 1993

[51] Int. Cl.⁵ .......................................... H01L 21/607
[52] U.S. Cl. ..................................... 228/111; 228/208; 437/194; 437/197
[58] Field of Search ............... 228/110, 111, 123, 179, 228/208, 180.2, 263.12; 437/190, 192, 194, 197

[56] References Cited

U.S. PATENT DOCUMENTS

| 4,040,885 | 8/1977 | Hight et al. | 228/110 |
| 4,842,662 | 6/1989 | Jacobi | 156/633 |
| 4,893,742 | 1/1990 | Bullock | 228/110 |
| 4,917,286 | 4/1990 | Pollacek | 228/110 |
| 4,927,505 | 5/1990 | Sharma et al. | 204/34.5 |
| 4,950,866 | 8/1990 | Kojima et al. | 228/110 |
| 5,110,034 | 5/1992 | Simmonds | 228/111 |

*Primary Examiner*—Samuel M. Heinrich
*Attorney, Agent, or Firm*—Schneck & McHugh

[57] ABSTRACT

A method of electrically connecting a tape automated bonding lead to an aluminum input/output pad of an integrated circuit includes sequentially sputtering an adhesive layer, a diffusion barrier layer and a gold layer on the input/output pad. The adhesive layer is a metallic film having good step coverage and adhesive properties to contact the pad. The diffusion barrier layer is formed atop the adhesive layer and is sandwiched by the gold layer. The method employs "bumpless" techniques and the bond lead is connected to the gold layer by applying a combination of pressure and vibrational energy.

17 Claims, 3 Drawing Sheets

1

BUMPLESS BONDING PROCESS HAVING MULTILAYER METALLIZATION

DESCRIPTION

1. Technical Field

The present invention relates generally to electrically connecting a bond lead to an input/output pad of an integrated circuit and relates more particularly to bumpless attachment of a tape automated bonding frame to an integrated circuit chip.

2. Background Art

The conventional method of attaching bond leads of a tape automated bonding frame to contact pads of an integrated circuit die requires forming conductive bumps on the contact pads. The contact pads are typically aluminum. Gold is electroplated at the contact pads to a height of approximately 25 $\mu$m. Lead ends of the bonding frame are then brought into contact with the electroplated gold bumps and the temperature is elevated to electrically and mechanically bond the lead ends to the gold bumps.

U.S. Pat. No. 4,842,662 to Jacobi identifies a number of difficulties with this conventional process. One identified difficulty is the complexity of fabricating gold bumps. Furthermore, there are certain spatial and mechanical drawbacks resulting from the fact that the gold bumps often have a rounded top contour. The contour causes mating problems. For example, when a flat lead end is forced onto a rounded top contour, the lead end may slide somewhat, potentially causing contact between adjacent leads.

Jacobi describes an alternative method of attaching bonding frame leads to the aluminum input/output pads of an integrated circuit chip. The lead ends are brought into direct contact with the aluminum input/output pads. The lead ends are ultrasonically vibrated to cause a bonding of the materials. Typically, the frame leads are copper members having a coating of gold. The ultrasonic vibration bonds the three materials. This operation is also described in U.S. Pat. No. 4,917,286 to Pollacek, and is referred to as a "bumpless" tape automated bonding (TAB) method. Jacobi and Pollacek teach that because the method allows direct connection between the lead ends and the aluminum input/output pads, the manufacturing cost is reduced and manufacturing yield is improved.

It is an object of the present invention to provide a method which further improves the interconnection of a lead frame to input/output pads of an integrated circuit chip.

SUMMARY OF THE INVENTION

The above object has been met by a method which is able to achieve the advantages of both the conventional gold bump process and the bumpless bonding method. The present method utilizes ultrasonic bonding and is bumpless, but a film of gold is formed on an aluminum input/output pad prior to attachment to a lead end of a bond lead. The gold film provides a more reliable electrical and mechanical connection.

An adhesive layer is sandwiched between the aluminum input/output pad and the gold film. In a preferred embodiment, a diffusion barrier layer is formed between the adhesive layer and the gold film. Each of the three layers that are atop the input/output pad can be formed using sputtering techniques.

The gold film retards oxidation of the aluminum input/output pad, thereby improving stability of the contact area. Moreover, gold has a lower contact resistance than aluminum. The diffusion barrier layer below the gold film prevents the gold from diffusing into the aluminum. The diffusion barrier layer may be palladium, nickel, chromium or platinum, but this is not critical.

The adhesive layer has desirable characteristics with respect to adhering to the aluminum input/output pad. Possible materials include commercially available titanium-tungsten (TiW), titanium and chromium. Optionally, the adhesive layer and the diffusion barrier layer may be combined, as for example by nitrifying a TiW or Ti layer to achieve the desired adhesion and barrier characteristics.

An advantage of the present invention is that improved mechanical and electrical results are possible without requiring steps having the complexity of forming gold bumps. The three layers can be sputtered onto the integrated circuit, whereafter the combination of vibrational energy and pressure is used to connect lead ends to input/output pads. Another advantage is that the multi-layer scheme forms a hermetic seal for the aluminum input/output pad.

BEST MODE FOR CARRYING OUT THE INVENTION

Figure 1:
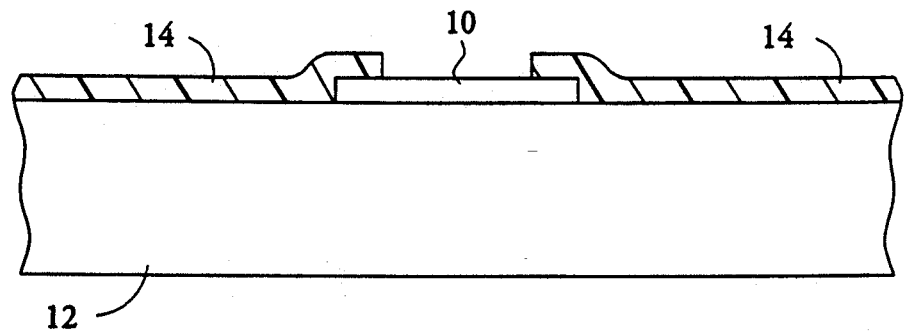
FIG. 1 is a side sectional view of an integrated circuit chip having an input/output pad on an upper surface in accordance with the present invention.

With reference to FIG. 1, an aluminum input/output pad 10 is shown on a semiconductor substrate 12. "Aluminum" is defined as including aluminum alloys and other such highly conductive materials used to form input/output pads on an integrated circuit. Also shown is a passivation layer 14 that extends onto the input/output pad. The passivation layer may be formed by chemical vapor deposition of a nonconductive material such as silicon oxynitride. The passivation layer may have a thickness in the range of 0.5 micron to 3 microns, but this is not critical.

The aluminum input/output pad 10 is used to supply a signal or a utility to the semiconductor substrate 12. Alternatively, the pad is of the type to channel a signal from the semiconductor substrate to another component, not shown.

Figure 2:
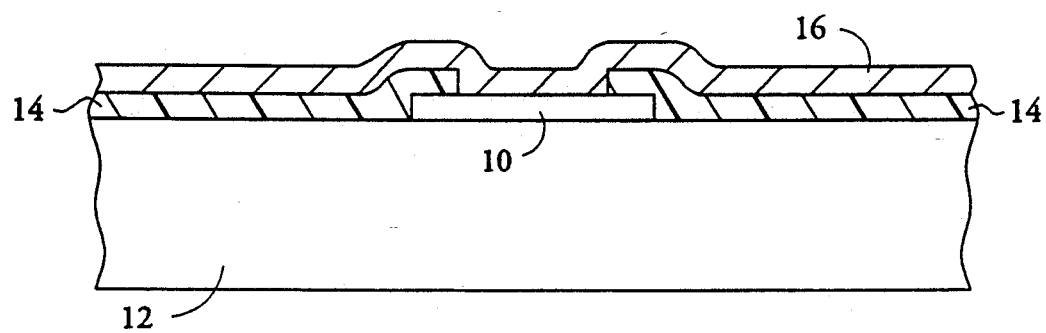
FIG. 2 is a side sectional view of the chip of FIG. 1 having an adhesive layer.

In FIG. 2, the upper surface of the semiconductor substrate 12 has been coated with an adhesive layer 16.

While not critical, the preferred material is titanium-tungsten. The titanium-tungsten is sputtered onto the passivation layer 14 and the input/output pad 10. A typical thickness is 1000 to 2000Å. The titanium-tungsten exhibits the desired characteristics with regard to step coverage and adhesion to the passivation layer and the input/output pad. Other possible materials are titanium and chromium. As will be described below, the use of a nitrided titanium layer or a nitrided titanium-tungsten layer allows the material to also serve the function of retarding diffusion of atoms from subsequently deposited layers into the aluminum of the input/output pad 10.

Figure 3:
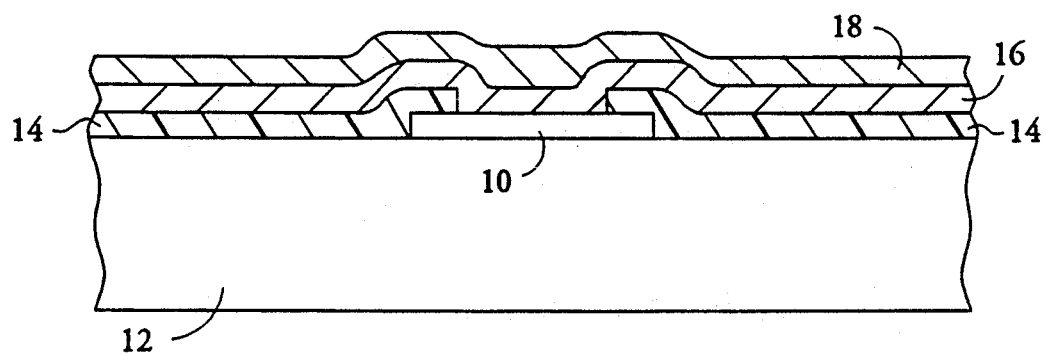
FIG. 3 is a side sectional view of the chip of FIG. 2 having a diffusion barrier layer.

Following formation of the adhesive layer 16, a diffusion barrier layer 18 is deposited onto the upper surface of the substrate. As shown in FIG. 3, the diffusion barrier layer coats the adhesive layer 16. Again, a material having high electrical conductance is required. In a preferred embodiment, palladium is selected, but other materials, such as nickel, palladium, chromium or platinum, can be employed. The diffusion barrier layer is sputtered to a thickness of 1000 to 2000Å. The layer has a sufficiently low porosity to retard diffusion of atoms between layers on opposite sides of the diffusion barrier layer.

Figure 4:
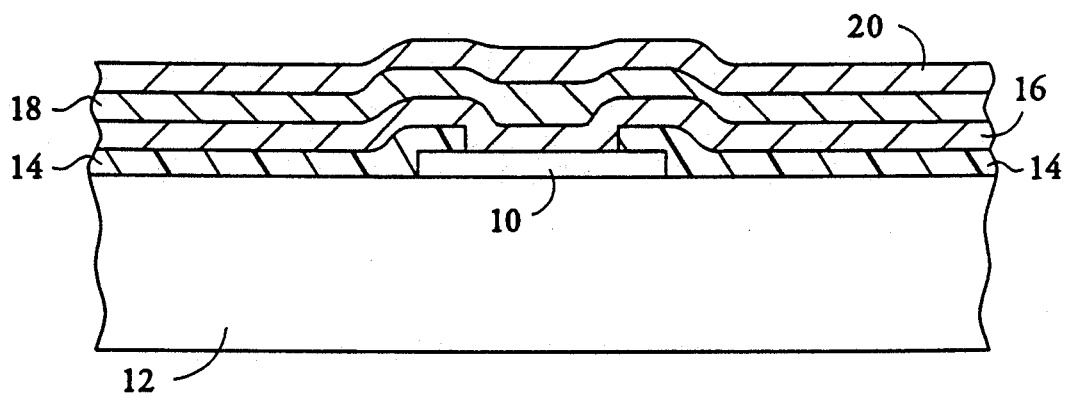
FIG. 4 is a side sectional view of the chip of FIG. 3 having a noble metal layer.

In FIG. 4, another conductive layer has been added to the semiconductor substrate 12. A gold layer 20 coats the diffusion barrier layer 18. While the thickness of the gold layer is not critical, the thickness is preferably in the range of 2000 to 15,000Å. The function of the gold layer is to provide a surface for ultrasonic bonding of a lead frame to the semiconductor substrate. Moreover, the gold layer acts to inhibit oxidation of the aluminum input/output pad 10, thereby extending the life and the reliability of the device. While other noble metals may be used, gold is the preferred material.

Figure 5:
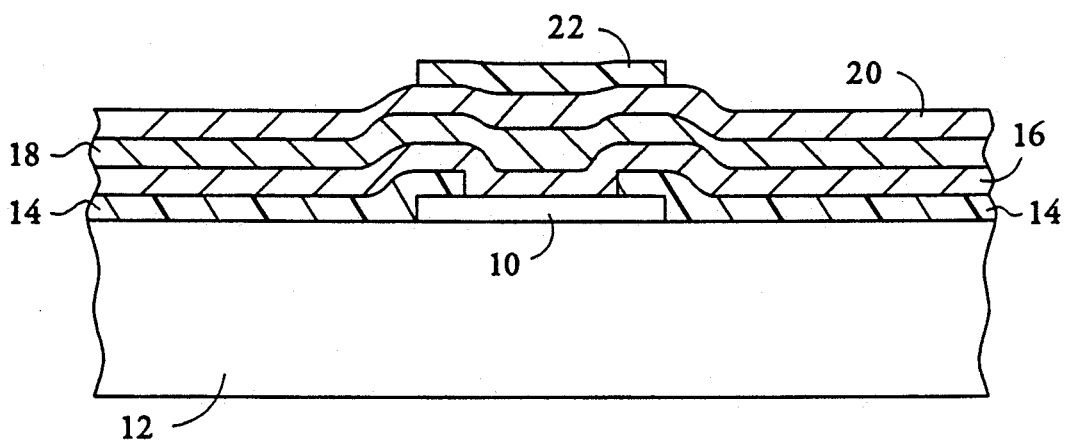
FIG. 5 is a side sectional view of the chip of FIG. 4 having photoresist material patterned thereon.
Figure 6:
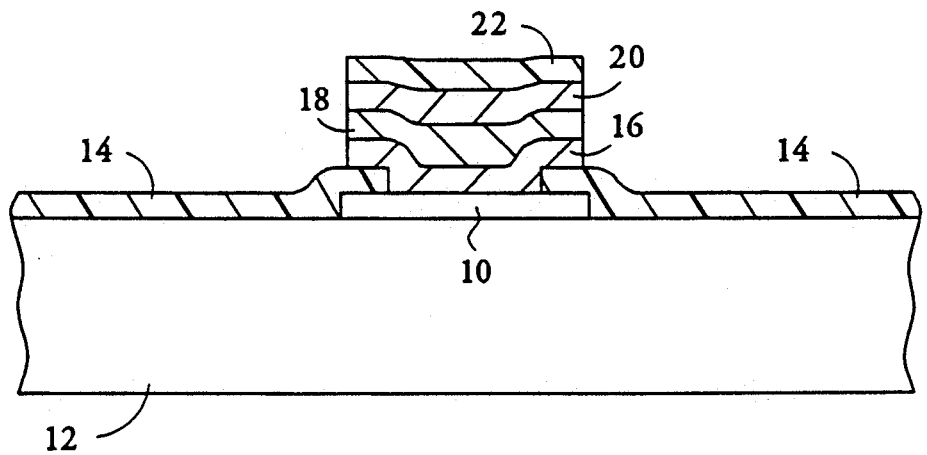
FIG. 6 is a side sectional view of the chip of FIG. 5 following etching of metallic layers exposed at the sides of the photoresist material.

Referring now to FIGS. 5 and 6, photolithographic techniques are utilized to pattern the gold layer 20, the diffusion barrier layer 18, and the adhesive layer 16. A photoresist layer 22 is formed and patterned to cover only that portion of the gold layer 20 that is to be used for contact to a bond lead. An etchant removes the exposed metal of the gold layer 20, the diffusion barrier layer 18, and the adhesive layer 16.

Figure 7:
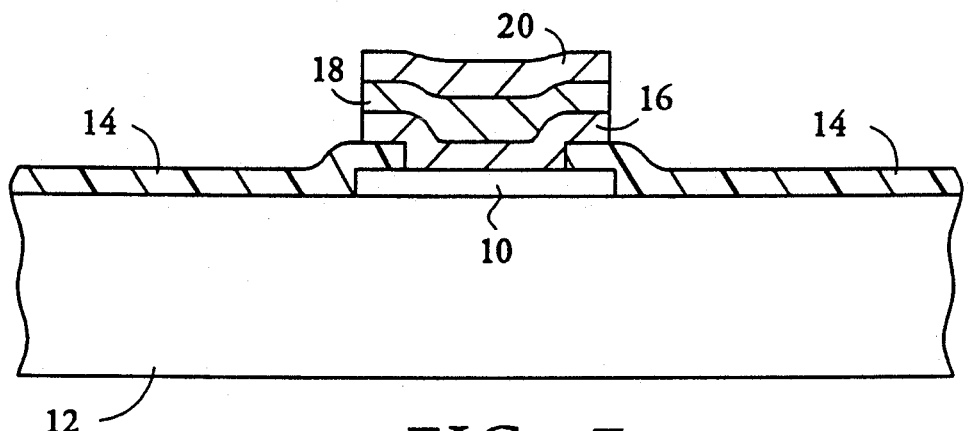
FIG. 7 is a side sectional view of the chip of FIG. 6 following removal of the photoresist material.

The photoresist layer 22 is then removed. As shown in FIG. 7, the result is a tri-metal structure that functions as a hermetic seal for the aluminum input/output pad 10 and that provides a desirable surface for ultrasonic bonding. As compared to gold bump contacts in which the gold bumps have a height of approximately 25 μm, the thin film gold layer 20 does not add significantly to fabrication complexity. Rather, the tri-metal structure is manufactured using known sputtering and photolithographic techniques. While electroplating the gold layer is an alternative embodiment, the sputtering technique increases manufacturing yield and decreases fabrication complexity.

Figure 8:
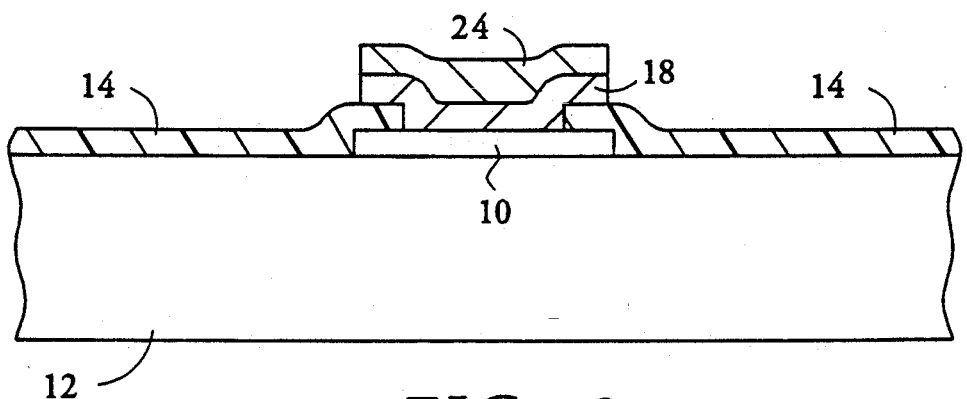
FIG. 8 is a side sectional view of a second embodiment of the chip of FIG. 7.

As noted above, the adhesive layer may undergo treatment to incorporate nitride so as to increase the diffusion-barrier characteristics of the layer. Where titanium or titanium-tungsten has undergone such treatment, the resulting TiN or TiWN layer 24 shown in FIG. 8 substitutes for the separate adhesive and barrier layers described above. However, the remainder of the structure is unchanged.

Figure 9:
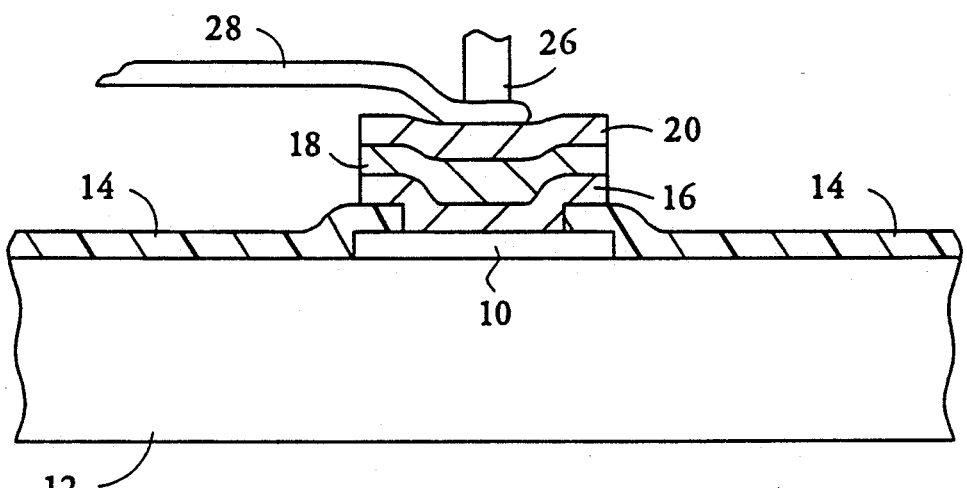
FIG. 9 is a side sectional view of the chip of FIG. 7 having a bond lead ultrasonically bonded thereto.

FIG. 9 illustrates the use of a bonding tool 26 to simultaneously apply pressure and vibrational energy to the end of a lead 28 of a tape automated bonding frame. Ultrasonic energy at a frequency of 60 kHz having a movement of approximately 75 microinches may be employed, but this is not critical. Heating the structure during the bonding process offers advantages. However, the bonding process does not require the application of heat. A proper bond is achieved in less than one second.

For best bonding results, the copper leads should have a hardness in the range of 100 $KH_{50} \pm 30$ as tested per ASTM 8-578-80.

I claim:

1. A method for electrically connecting an integrated circuit and a bond lead comprising,
   providing an integrated circuit,
   forming a conductive input/output pad on the integrated circuit,
   forming a conductive inner layer on the input/output pad for joining the input/output pad to a noble metal,
   forming a noble metal layer on the inner layer,
   aligning a lead end of a bond lead to the input/output pad, including contacting the lead end to the noble metal layer, and
   ultrasonically bonding the lead end to the noble metal layer, including applying a force to the lead end to vibrate the lead end.

2. The method of claim 1 wherein forming the input/output pad is a step of forming an aluminum pad.

3. The method of claim 1 wherein forming the conductive inner layer is a step including selecting a metal from the group consisting of titanium-tungsten, titanium, titanium nitride, and chromium.

4. The method of claim 1 wherein forming the conductive inner layer is a step of forming an adhesive layer, the method further comprising forming a diffusion barrier layer on the adhesive layer prior to the forming of the noble metal layer.

5. The method of claim 4 wherein forming the diffusion barrier layer is a step including selecting a metal from the group consisting of palladium and nickel.

6. The method of claim 1 wherein forming the noble metal layer is a step of forming a gold layer.

7. The method of claim 1 wherein the ultrasonic bonding of the lead end to the noble metal layer is a step carried out in the absence of a metallic bump above the input/output pad and in the absence of a metallic bump on the lead end.

8. A method for electrically connecting an integrated circuit and a bond lead comprising,
   fabricating an integrated circuit on a semiconductor substrate,
   forming an input/output pad on the integrated circuit such that the input/output pad is made of a metal selected from the group consisting of aluminum and aluminum alloy,
   forming a metallic adhesive layer on the input/output pad,
   forming a metallic diffusion barrier layer on the adhesive layer,
   forming a gold layer on the diffusion barrier layer,
   contacting a lead end of a bond lead to said gold layer, and
   applying a combination of pressure and vibrational energy to the lead end such that the lead end is bonded to the gold layer.

9. The method of claim 8 wherein forming the adhesive layer, the diffusion barrier layer and the gold layer are such that each is generally equal with respect to dimensions parallel to an upper surface of the semiconductor substrate.

10. The method of claim 8 carried out in the absence of sputtering gold, forming the gold layer being a step of sputtering gold.

11. The method of claim 8 further comprising providing a tape automated bonding frame that includes the bond lead.

12. The method of claim 8 wherein applying the combination of pressure and vibrational energy is a step of ultrasonically bonding the lead end to the gold layer.

13. A method for electrically connecting an integrated circuit and a bond lead comprising,
providing a semiconductor substrate having an integrated circuit, the integrated circuit having a contact area,
forming an aluminum pad on the contact area,
sputtering a film having titanium onto the aluminum pad,
sputtering a diffusion barrier layer onto the titanium film,
sputtering a film having gold on the diffusion barrier layer, and
ultrasonically bonding a lead of a tape automated bonding frame directly to the sputtered gold film, including vibrating the lead when the lead is in contact with the gold film.

14. The method of claim 13 further comprising patterning the titanium film, the diffusion barrier layer and the gold film prior to the ultrasonic bonding.

15. The method of claim 13 wherein the titanium film includes tungsten.

16. The method of claim 13 wherein the ultrasonic bonding includes pressing the lead onto the gold film.

17. The method of claim 13 wherein the gold film is formed in the absence of electroplating processes.

* * * * *

UNITED STATES PATENT AND TRADEMARK OFFICE
CERTIFICATE OF CORRECTION

PATENT NO. : 5,249,728
DATED : October 5, 1993
INVENTOR(S) : Ken Lam

It is certified that error appears in the above-indentified patent and that said Letters Patent is hereby corrected as shown below:

Claim 10, column 5, line 5, "sputtering" should read -- electroplating --.

Signed and Sealed this

Twenty-sixth Day of April, 1994

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. :   5,249,728
DATED      :   October 5, 1993
INVENTOR(S) :  Ken Lam and William D. Gross It is certified that error appears in the above-indentified patent and that said Letters Patent is hereby corrected as shown below:

On the title page, item [75], add -- William D. Gross--
Column 4, line 11, "I claim:" should read - - We claim: - -.

Signed and Sealed this

Sixteenth Day of April, 1996

*Attest:*

BRUCE LEHMAN

*Attesting Officer*         Commissioner of Patents and Trademarks